(12) United States Patent
Nishiura et al.

(10) Patent No.: US 6,874,673 B2
(45) Date of Patent: Apr. 5, 2005

(54) INITIAL BALL FORMING METHOD FOR WIRE BONDING WIRE AND WIRE BONDING APPARATUS

(75) Inventors: Shinichi Nishiura, Fussa (JP); Mitsuaki Sakakura, Iruma (JP); Fumio Miyano, Akiruno (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 98 days.

(21) Appl. No.: 10/462,879

(22) Filed: Jun. 17, 2003

(65) Prior Publication Data

US 2004/0000577 A1 Jan. 1, 2004

(30) Foreign Application Priority Data

Jun. 26, 2002 (JP) .......................... 2002-186732

(51) Int. Cl.$^7$ .......................... B23K 31/02; B23K 37/00
(52) U.S. Cl. ................... 228/180.5; 228/4.5; 219/76.13
(58) Field of Search .............................. 228/180.5, 4.5; 219/76.13; 438/613

(56) References Cited

U.S. PATENT DOCUMENTS

| | | | | |
|---|---|---|---|---|
| 4,998,002 A | * | 3/1991 | Okikawa et al. | ......... 219/56.22 |
| 5,152,450 A | * | 10/1992 | Okikawa et al. | ......... 228/180.5 |
| 5,176,310 A | * | 1/1993 | Akiyama et al. | ......... 228/180.5 |
| 5,285,949 A | * | 2/1994 | Okikawa et al. | ......... 228/179.1 |
| 6,110,823 A | * | 8/2000 | Eldridge et al. | ............ 438/660 |
| 6,270,000 B1 | * | 8/2001 | Nishiura | .................. 228/180.5 |
| 6,564,989 B2 | * | 5/2003 | Arakawa | ................. 228/180.5 |
| 6,776,324 B2 | * | 8/2004 | Morita | ....................... 228/1.1 |
| 2003/0098330 A1 | * | 5/2003 | Morita | ....................... 228/4.5 |
| 2004/0000577 A1 | * | 1/2004 | Nishiura et al. | ......... 228/180.5 |
| 2004/0000578 A1 | * | 1/2004 | Nishiura et al. | ......... 228/180.5 |

* cited by examiner

Primary Examiner—Kiley S. Stoner
(74) Attorney, Agent, or Firm—Koda & Androlia

(57) ABSTRACT

A wire bonding apparatus having a capillary with a wire passing therethrough; and when the switch of a first direct-current high-voltage power supply is switched ON, a space discharge takes place between the tip end of the wire and a torch electrode, and the tip end of the wire is melted by the discharge, making a ball-form ball base. When the switch of a second high-voltage power supply is switched ON, a space discharge takes place between a pair of dissociated gas forming electrodes made of a coating material whose melting point is lower than that of the wire, so that a dissociated gas containing tin ions is formed. The ball base is positioned inside the dissociated gas, and thus, tin adheres to the surface of the ball base, and an initial ball with a low-melting-point coating material adhering to the surface is formed.

8 Claims, 3 Drawing Sheets

INITIAL BALL FORMING METHOD FOR WIRE BONDING WIRE AND WIRE BONDING APPARATUS

BACKGROUND OF THE INVENTION

1. Field of the Invention

The present invention relates to an initial ball forming method for a wire used in wire bonding and to a wire bonding apparatus.

2. Prior Art

In wire bonding techniques, input and output terminals, etc. (bonding pads) of semiconductor chips such as LSIs, etc. and terminals (bonding leads) of packages or circuit boards on which the semiconductor chips are mounted are connected by fine metal wires.

Gold wires, for instance, are used as the wires that connect bonding pads and bonding leads; and when such gold wires are initially bonded to the bonding pads, the tip end of a gold wire that is passed through a tube called a capillary is formed into a ball shape. The ball-shaped entity that is formed on the tip end of this gold wire is generally called an initial ball. Such a general initial ball is obtained by applying a high voltage across the wire and a torch electrode that is disposed so as to face the tip end of the wire, so that a space discharge is caused to take place between the electrode and the wire, thus melting the tip end of the wire by the energy of this discharge, thus making the tip end into a ball shape. In this case, the material of the torch electrode that is used generally has a higher melting point than that of the wire material.

The process that connects by wires the bonding pads and bonding leads is performed in two stages. First, a first-stage bonding operation is performed by pressing the general initial ball against the aluminum bonding pad of the semiconductor chip, and applying ultrasonic energy while heating this initial ball. Then, the wire is extended from the end that is bonded to the aluminum bonding pad, and the other end of the wire is moved to a point above the gold bonding lead of the circuit board to which the wire is to be bonded. Then, a second-stage bonding operation is performed by pressing the other end of the moved wire against this bonding lead, and applying ultrasonic energy while heating the wire.

In the bonding of the bonding pad and gold wire, a specified wire bonding strength, e.g., peeling strength, can be obtained by setting the pressing pressure, heating temperature and ultrasonic energy that is applied at appropriate values. The thermal energy created by heating has the function of making it possible to reduce the ultrasonic energy that is required; for example, in cases where heating can be performed at a sufficiently high temperature, bonding can be accomplished without applying ultrasonic energy. There are various theories regarding the mechanism of the bonding between an aluminum bonding pad and a gold wire; however, it appears that the aluminum surface oxide film is ruptured by the energy that is applied, and that the underlying newly generated aluminum surface and the gold are bonded by a type of eutectic phenomenon.

Thus, in the case of conventional wire bonding, gold wires have generally been bonded to aluminum bonding pads. In recent years, as ultra-fine miniaturization of LSIs has progressed, copper wiring techniques which makes it possible to lower the wiring resistance inside semiconductor chips have attracted attention. In such cases, it is preferable to use copper materials for the bonding pads, both from the standpoint of the process and the standpoint of materials.

However, bonding of gold wires to copper bonding pads involves several problems. More specifically, a copper oxide film is formed on the surfaces of copper bonding pads, and this oxide film on the copper surface has extremely poor bonding characteristics compared to the oxide film formed on the surfaces of aluminum bonding pads. For example, even if the general initial ball of a gold wire is pressed against the surface of a copper bonding pad and ultrasonic energy of considerable strength is applied, this merely results in the generation of several fractures in the general initial ball; and no bonding occurs between the copper and gold. Furthermore, when the copper surface is heated, oxidation occurs more violently as the metal color of the surface varies conspicuously. Accordingly, it is difficult to utilize thermal energy generated by heating.

This problem comes from the fact that the manner in which copper is oxidized differs from the manner in which aluminum is oxidized. In other words, as is well known, the surface of aluminum is easily oxidized; however, the resulting oxide film is dense; and when this film grows to a certain fixed film thickness, there is almost no further oxidation. Furthermore, the surface oxide film on aluminum is also stable in chemical terms, and any oxide film of this type has more or less fixed physical characteristics. Accordingly, the wire bonding conditions such as pressing pressure, heating temperature, ultrasonic energy, etc. that are used to rupture the surface oxide film on an aluminum bonding pad can be set with good reproducibility.

On the other hand, the oxide film that is formed on the surface of copper has a low density, and oxidation continues to progress toward the interior of the copper. Furthermore, in the case of a copper oxide film, both the film thickness and the physical properties show a large amount of variation according to the degree of oxidation. Accordingly, a thick copper oxide film has great variation in physical properties, etc., which cannot be compared with the surface oxide film on an aluminum bonding pad, is present on the surface of a copper bonding pad. Furthermore, the presence of this surface oxide film on a copper bonding pad constitutes a great impediment to wire bonding.

SUMMARY OF THE INVENTION

Accordingly, the object of the present invention is to solve such problems encountered in the prior art and to provide an initial ball forming method for a wire bonding wire and a wire bonding apparatus that can use copper as the object of wire bonding.

The present invention is based on the finding that a gold wire can easily be bonded to a copper bonding pad if an initial ball which has a low-melting-point material adhering to the surface is used.

The content of a bonding experiment involving bonding between an initial ball with a low-melting-point material adhering to the surface and a copper bonding pad will be described below.

A circuit board on which an LSI chip with copper bonding pads was mounted was set on the bonding table of a bonding apparatus. A gold wire with a diameter of 20 microns ($\mu$m) was passed through the capillary of the bonding apparatus. A discharge voltage was applied across the wire and a torch electrode made of a coating material (tin) which had a lower melting point than that of the wire. The tip end of the wire was melted and formed into a ball shape, and tin ions were caused to adhere to the surface of this ball shape using the energy of the discharge. Then, the capillary holding the initial ball with tin adhering to the surface was moved, the ball was pressed against one of the copper bonding pads, and ultrasonic energy was applied to this initial ball and the copper bonding pad by ultrasonic energy supplying means. Bonding was attempted at ordinary temperature, without heating the substrate, etc., on which the LSI chip was mounted.

The pressing force was 400 mN (a weight of approximately 40 grams), and the press-bonding diameter constituting the planar dimension following deformation of the initial ball by this pressing force was approximately 50 microns ($\mu$m). The magnitude of the ultrasonic energy was the same as that used in the wire bonding of a gold wire to an ordinary aluminum pad. As a result, the gold wire and copper bonding pad were bonded, and the peeling strength was sufficient for practical purposes.

Thus, by pressing an initial ball with tin adhering to the surface against a copper bonding pad, and applying ultrasonic energy, it was possible to obtain a bond with a sufficient peeling strength (approximately 200 mN or a weight of 20 grams) at ordinary temperature between this copper bonding pad and a gold wire.

In regard to the mechanism of bonding, for example, it is possible to consider a model in which the low-melting-point tin is melted by the ultrasonic energy, and ultrasound acts on the melted tin so that cavitation occurs, i.e., so that bubbles in a vacuum state are generated. More specifically, according to this model, a shock wave is generated when the bubbles in a vacuum state rupture, and the thick copper oxide film is destroyed by this shock wave, so that bonding takes place between the underlying newly generated copper surface and the initial ball. It is well known that heat is generated in a metallic solid by ultrasonic energy, and it is also well known that cavitation can be generated in a liquid by ultrasonic energy.

Thus, it was found that by way of forming an initial ball with a low-melting-point material adhering to the surface and using this initial ball, gold wires and copper bonding pads can be bonded without heating the circuit board even if a thick copper oxide film is present.

Based upon the findings above, the initial ball forming method for a wire bonding wire of the present invention is characterized by the fact that a ball-form ball base is formed by applying a first discharge voltage across a wire and a torch electrode so that the tip end of the wire is melted, and a second discharge voltage is applied across a pair of dissociated gas forming electrodes made of a coating material that has a lower melting point than the wire, so that a dissociated gas of the coating material is formed in a manner that causes the ball base to be inside this gas and causing the coating material to adhere to the surface of the base.

In this method, a ball-form ball base can be formed on the tip end of the wire using discharge energy, and a coating material can be caused to adhere to the surface of this ball base using separate discharge energy. Accordingly, an initial ball in which a low-melting-point coating material is caused to adhere to the surface of the ball shape can be formed using discharge energy. Furthermore, even if a thick copper oxide film is present, a gold wire and copper bonding pad can be bonded by using this initial ball. Furthermore, the ball base formation process and the coating material adhesion process can be independently controlled.

It is preferable that the above-described first discharge voltage be a direct-current high voltage that places the wire at a plus potential with respect to the torch electrode. Moreover, besides being a wire that is chiefly made of gold, the wire can be a wire that is made of copper. Furthermore, it is preferable that the above-described low-melting-point coating material be a low-melting-point material that contains, as primary component, tin or indium.

Furthermore, the wire bonding apparatus of the present invention is characterized by the fact that the bonding apparatus is comprised of:

a capillary through which a wire is passed, the capillary positioning the wire so that the wire is caused to protrude from a tip end of the capillary;

a torch electrode which faces the wire;

a first discharge voltage application means which applies a first discharge voltage with the wire set at a plus potential with respect to the torch electrode, thus melting the tip end of the wire and making a ball-form ball base;

a pair of dissociated gas forming electrodes which are made of a coating material that has a lower melting point than that of the wire; and a second discharge voltage application means which applies a second discharge voltage across the pair of dissociated gas forming electrodes, thus forming a dissociated gas of the coating material in a manner that causes the ball base to be contained inside the dissociated gas, and causing the coating material to adhere to a surface of the ball base.

DETAILED DESCRIPTION OF THE INVENTION

Figure 1:
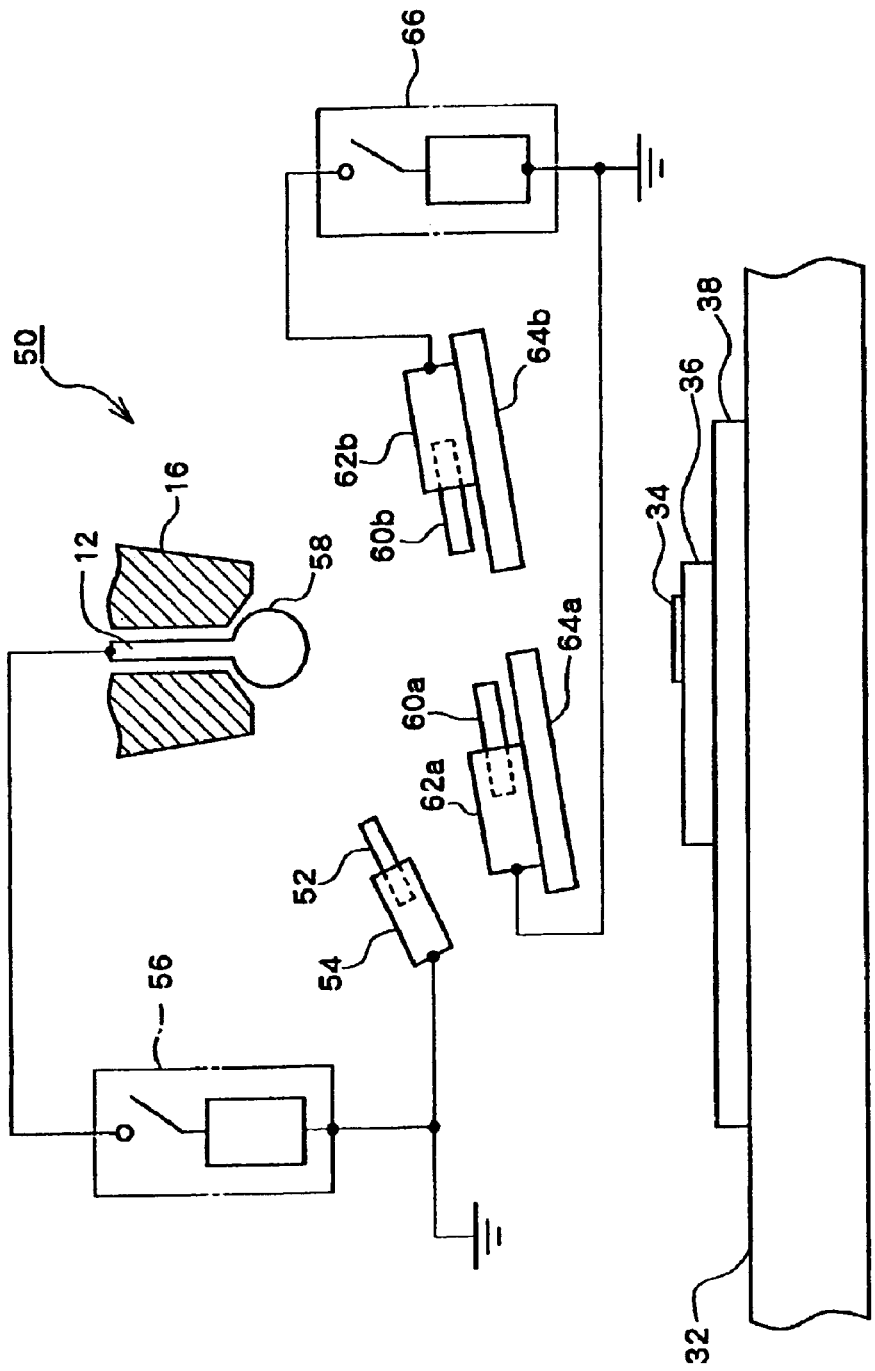
FIG. 1 is a illustrates how an initial ball with a low-melting-point coating material adhering to a surface of the initial ball is formed in the wire bonding apparatus according to one embodiment of the present invention.

Embodiment of the present invention will be described in detail below with reference to the accompanying drawings. FIG. 1 shows how an initial ball 58 is formed on the tip end of a wire 12 that is used in wire bonding in a wire bonding apparatus 50.

In FIG. 1, the wire bonding apparatus 50 is comprised of: a capillary 16 through which a wire 12 is passed and which positions this wire so that the wire protrudes from the tip end of the capillary, a torch electrode 52 which is disposed so as to face the tip end of the wire 12, a torch electrode supporting element 54 which supports the torch electrode 52, and a first direct-current high voltage power supply 56 which applies a discharge voltage across the wire 12 and torch electrode 52.

The wire bonding apparatus 50 is further comprised of a pair of dissociated gas forming electrodes 60a and 60b, a pair of dissociated gas forming electrode supporting elements 62a and 62b disposed in positions that correspond to these electrodes, a pair of protective covers 64a and 64b made of an insulating material which are disposed on the opposite sides of the supporting elements from the sides facing the wire, and a second high-voltage power supply 66. Furthermore, a bonding table 32 is installed in the wire bonding apparatus 50. The bonding table can hold an LSI chip 36, which has bonding pads 34, and a circuit board 38.

The first direct-current high voltage power supply 56 is a means for applying a first discharge voltage that causes a discharge to take place between the wire 12 and the torch electrode 52. The voltage power supply 56 is connected so that the wire 12 is placed at a plus potential with respect to the torch electrode 52.

The second high-voltage power supply 66 causes a discharge to occur in air by applying a second discharge voltage across the pair of dissociated gas forming electrodes 60a and 60b, and it has the function of forming a dissociated gas that contains ions of a low-melting-point coating material as will be described below.

A coating material, which has a melting point that is lower than that of the wire, e.g., a low-melting-point material contains, as primary component, tin which has a melting point of approximately 230° C., can be used as the material of the pair of dissociated gas forming electrodes 60a and 60b. Alternatively, a low-melting-point material that contains, as primary component, indium which has a melting point of approximately 150° C. can be used. Some other alloy which has a melting point that is lower than that of the wire can be used also. For example, an alloy which has a melting point between 110° C. and 240° C. can be used.

Each of the dissociated gas forming electrodes 60a and 60b can be made entirely of a low-melting-point coating material, or only portions of these electrodes can be made of a low-melting-point coating material. For example, only the tip ends of the respective dissociated gas forming electrodes 60a and 60b can be made of a low-melting-point coating material, or only the outer circumferential portions of these electrodes can be made of a low-melting-point coating material. Furthermore, as will be described below, a diffusion directionality member that imparts directionality to the direction of diffusion when a dissociated gas is formed by ionizing and diffusing the low-melting-point material by means of the above-described discharge can also be provided. For example, the circumference of the low-melting-point material is covered by an insulating material, and a hole is formed in a portion of this insulating material, so that the low-melting-point material has diffusion directionality in the direction of the hole.

The dissociated gas forming electrode supporting elements 62a and 62b attach and support the respective dissociated gas forming electrodes 60a and 60b so that these electrodes can be replaced. The supporting elements 62a and 62b also have the function of transmitting the discharge voltage from the second high-voltage power supply 66 to the respective dissociated gas forming electrodes 60a and 60b. For example, these supporting elements can be constructed from metal members that have holes, into which the dissociated gas forming electrodes are inserted, and bolts, which fasten the inserted dissociated gas forming electrodes in place while establishing electrical continuity with these electrodes.

In the wire bonding apparatus 50 shown in FIG. 1, the procedure that forms an initial ball which has a low-melting-point coating material adhering to the surface can be divided into two processes. Such process include: a ball base formation process that melts the tip end of the wire 12 so as to form a ball-form ball base, and a coating process that causes a low-melting-point coating material to adhere to the surface of this ball base.

Figure 2:
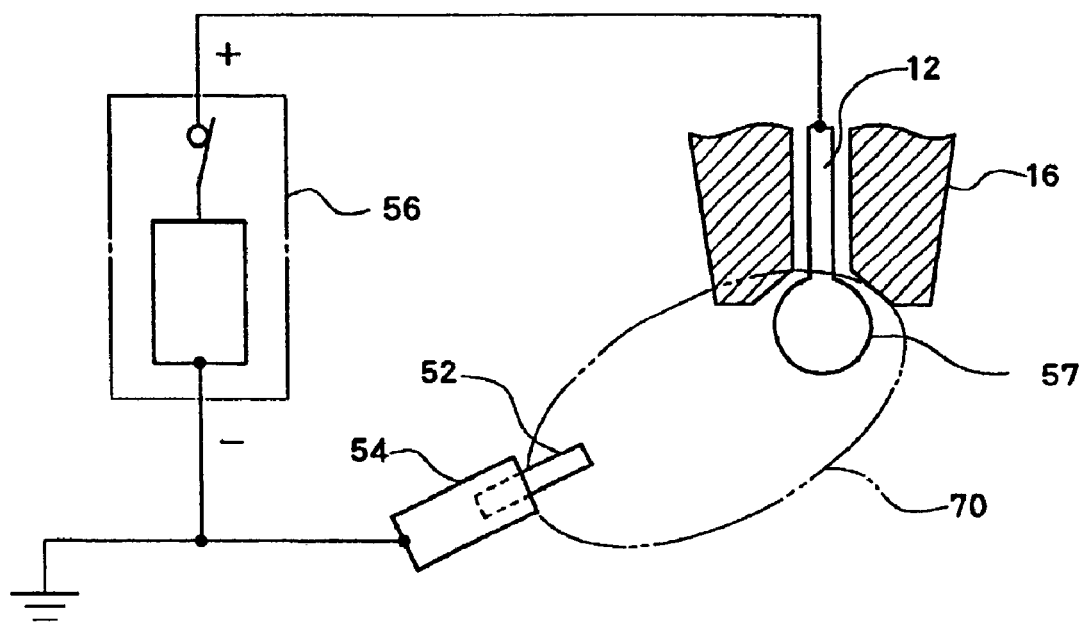
FIG. 2 illustrates the ball base formation process.

FIG. 2 illustrates the ball base formation process.

A gold wire with a diameter of 20 microns ($\mu$m) is used as the wire 12. The wire 12 is first passed through the capillary 16 and is positioned by means of a clamping mechanism (not shown) so that the tip end of the wire protrudes from the capillary 16. Next, the torch electrode 52 held by the torch electrode holder 54 is moved by a moving mechanism (not shown) so that the torch electrode 52 and the tip end of the wire 12 are positions in a specified facing relationship. Then, the switch of the first direct-current high voltage power supply 56 is switched ON, so that a discharge voltage is applied across the wire 12 and torch electrode 52. As a result, a space discharge takes place in the region 70 between the tip end of the wire 12 and the torch electrode 52, so that the tip end of the wire 12 is heated and melted, thus forming a ball-form ball base 57. The discharge time is several milliseconds.

The first discharge voltage is set as a direct-current high voltage that places the wire at a plus potential with respect to the torch electrode. As a result, the deposition on the wire of plus ions in the atmosphere that causes contamination can be reduced. It is known that the initiation of a space discharge occurs from the entire surface of the electrode on the minus potential side toward the tip end of the electrode on the plus potential side. Since the wire is placed at a plus potential with respect to the torch electrode, the discharge from the entire surface of the wire is suppressed, so that the discharge can easily be concentrated between the tip end of the wire and the torch electrode. Accordingly, the shape of the ball base can be formed with good control and with little contamination.

Figure 3:
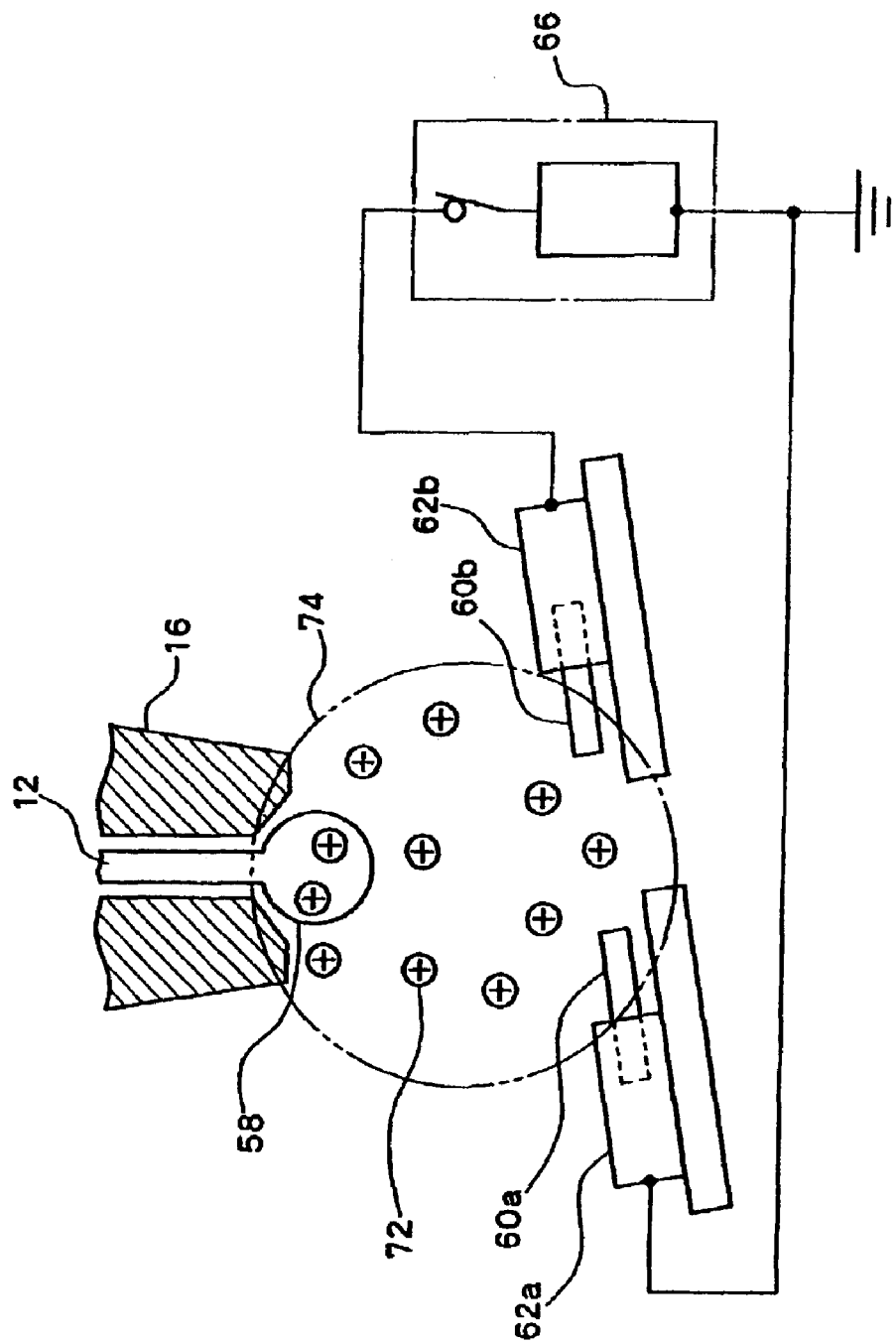
FIG. 3 illustrates the coating process of the present invention.

FIG. 3 shows the coating process.

First, the torch electrode 52 is retracted by a moving mechanism (not shown). Next, the respective dissociated gas forming electrodes 60a and 60b attached to the respective dissociated gas forming electrode supporting elements 62a and 62b are moved using another moving mechanism (not shown) so that the tip ends of the respective dissociated gas forming electrodes 60a and 60b are positioned in a specified facing relationship. This positioning can also be a relationship that is fixed from the beginning without using a moving mechanism. The respective protective covers 64a and 64b in this case are disposed so that the discharge that forms the dissociated gas (described below) does not take place between the respective dissociated gas forming electrodes 60a and 60b and the LSI chip 36 or circuit board 38.

The pair of dissociated gas forming electrodes 60a and 60b that are positioned in the above-described specified facing relationship are positioned by another moving mechanism (not shown) in a specified positional relationship with the ball base 57 held in the capillary 16.

Next, the switch of the second high-voltage power supply 66 is switched ON, thus applying a discharge voltage across the pair of dissociated gas forming electrodes 60a and 60b. As a result, a space discharge takes place between the pair of dissociated gas forming electrodes 60a and 60b, and the tin of the dissociated gas forming electrodes 60a and 60b is also heated to a high temperature and diffused into space so that this tin is dissociated and ionized in the presence of a high voltage, thus forming a dissociated gas 74 that contains tin ions 72. In this case, the size of the dissociated gas 74 is adjusted by means of the discharge conditions so that the ball base is contained in the dissociated gas 74. Alternatively, the positional relationship between the above-described ball base 57 and the pair of dissociated gas forming electrodes 60a and 60b is adjusted so that the ball base 57 is contained in the dissociated gas 74.

Thus, since a dissociated gas 74 that contains tin ions is formed with the ball base 57 being therein, an initial ball 58 which has tin adhering to the surface can be obtained.

In order to perform bonding with a copper bonding pad 34 using this initial ball 58 with tin adhering to the surface, the capillary 16 is moved while holding this initial ball 58, so that the initial ball 58 is pressed against the copper bonding pad 34 on the LSI chip 36. Then, ultrasonic energy is applied across the pressed initial ball 58 and copper bonding pad 34 using ultrasonic energy application means (not shown).

As seen from the above, as described in Summary of the Invention section, a bond between a gold wire and a copper bonding pad that has a sufficient peeling strength for practical purposes is obtained by applying ultrasonic energy to the same extent as that used in the wire bonding of a gold wire to an ordinary aluminum pad.

In the above, wire bonding between a gold wire and a copper bonding pad is described. However, in the present invention, a wire that is chiefly made of copper can be used. In this case, the material of the mating bonding pad can be a material other than copper. For example, the pad can be an aluminum pad or a god pad. Furthermore, in the above, the copper bonding pad is described as the bonding pad of a semiconductor chip; however, the present invention is applicable to copper bonding leads of circuit boards.

As seen from the above, connections involving copper can be achieved by a simple and convenient method without any particular increase in the number of semiconductor manufacturing processes. Furthermore, a sufficient bonding strength is obtained even at ordinary temperatures, and a good connection quality is obtained without any effects of the oxidation of copper caused by a rise in temperature.

According to the initial ball forming method for a wire bonding wire and the wire bonding apparatus of the present invention, copper can be used as an object of wire bonding.

What is claimed is:

1. An initial ball forming method for a wire used in wire bonding comprising the steps of:

applying a first discharge voltage across a wire and a torch electrode so as to melt that the tip end of the wire, thus making a ball-form ball base; and applying a second discharge voltage across a pair of dissociated gas forming electrodes made of a coating material that has a lower melting point than said wire, thus forming a dissociated gas of said coating material in a manner that causes said ball base to be contained inside said dissociated gas, and causing said coating material to adhere to a surface of said ball base.

2. The initial ball forming method for a wire bonding wire according to claim 1, wherein said first discharge voltage is a direct-current high voltage that places said wire at a plus potential with respect to said torch electrode.

3. The initial ball forming method for a wire bonding wire according to claim 1 or 2, wherein said coating material is a low-melting-point material that contains, as primary component, one selected from the group consisting of tin and indium.

4. The initial ball forming method for a wire bonding wire according to claim 1 or 2, wherein said wire is chiefly made of one selected from the group consisting of gold and copper.

5. The initial ball forming method for a wire bonding wire according to claim 3, wherein said wire is chiefly made of one selected from the group consisting of gold and copper.

6. A wire bonding apparatus comprising:

a capillary through which a wire is passed, said capillary positioning said wire so that said wire is caused to protrude from a tip end of said capillary;

a torch electrode which faces said wire;

a first discharge voltage application means which applies a first discharge voltage with said wire set at a plus potential with respect to said torch electrode, thus melting a tip end of said wire and making a ball-form ball base;

a pair of dissociated gas forming electrodes which are made of a coating material that has a lower melting point than that of said wire; and a second discharge voltage application means which applies a second discharge voltage across said pair of dissociated gas forming electrodes, thus forming a dissociated gas of said coating material in a manner that causes said ball base to be contained inside said dissociated gas, and causing said coating material to adhere to a surface of said ball base.

7. The initial ball forming method for a wire bonding wire according to claim 6, wherein said coating material is a low-melting-point material that contains, as primary component, one selected from the group consisting of tin and indium.

8. The initial ball forming method for a wire bonding wire according to claim 6 or 7, wherein said wire is chiefly made of one selected from the group consisting of gold and copper.

* * * * *